(12) United States Patent
Joo

(10) Patent No.: US 6,717,849 B2
(45) Date of Patent: Apr. 6, 2004

(54) FLASH MEMORY DEVICE

(75) Inventor: Seok Jin Joo, Ichon (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/287,784

(22) Filed: Nov. 5, 2002

(65) Prior Publication Data

US 2003/0117849 A1 Jun. 26, 2003

(30) Foreign Application Priority Data

Dec. 20, 2001 (KR) ......................................... 2001-81940

(51) Int. Cl.$^7$ .............................................. G11C 16/04
(52) U.S. Cl. .............................. 365/185.05; 365/185.11
(58) Field of Search ....................... 365/185.05, 185.11, 365/185.29, 185.33

(56) References Cited

U.S. PATENT DOCUMENTS

| | | | | | |
|---|---|---|---|---|---|
| 5,023,837 | A | * | 6/1991 | Schreck et al. | 365/185.11 |
| 5,295,113 | A | * | 3/1994 | Dix et al. | 365/185.29 |
| 6,091,632 | A | * | 7/2000 | Yoshimi et al. | 365/185.11 |
| 6,104,636 | A | * | 8/2000 | Tada | 365/185.11 |
| 6,256,228 | B1 | * | 7/2001 | Hirano | 365/185.29 |
| 6,404,681 | B1 | * | 6/2002 | Hirano | 365/185.33 |
| 6,504,765 | B1 | * | 1/2003 | Joo | 365/185.29 |

* cited by examiner

Primary Examiner—Trong Phan
(74) Attorney, Agent, or Firm—Jacobson Holman PLLC

(57) ABSTRACT

The present invention relates to a flash memory device. The flash memory device comprises a first memory cell array having a plurality of first flash memory cells of which a gate of each cell of the plurality of first flash memory cells being connected to a respective first word line and a terminal of each cell of the plurality of first flash memory cells being connected to a respective first bit line; a plurality of switching parts each having first and second terminals, the first terminal of each switching part being connected to the respective first bit line; and a second flash memory cell array having a plurality of second flash memory cells of which a gate of each cell of the plurality of second flash memory cells being connected to a common second word line and a terminal of each cell of the plurality of second flash memory cells being connected to a respective second bit line; wherein the second terminals of the plurality of the switching parts are commonly connected to the common second word line. Therefore, the present invention can reduce the manufacturing cost of a product without increasing the chip size even though a self-converged erase mode is employed.

2 Claims, 4 Drawing Sheets

FLASH MEMORY DEVICE

BACKGROUND OF THE INVENTION

1. Field of the Invention

The invention relates generally to a flash memory device. More particularly, the invention relates to a flash memory device having a capacitor in which an erase switch is connected to each of word lines of one flash memory cell array and the other flash memory cell array is connected to a common terminal of the erase switch, thus reducing the manufacturing cost of a product without increasing a chip size while using a self-converged erase mode.

2. Description of the Prior Art

A flash memory cell being a non-volatile memory device, which can be electrically programmed and erased, is a semiconductor device used in portable electronic products such as notebook computers, PDAs, cellular phones, etc. and computer BIOS, printer, etc. In this flash memory cell, the threshold voltage of the cell is varied as electrons are moved due to a strong electric field to a thin tunnel oxide film of about 100 Å, so that program and erase operations are performed.

A general flash memory cell includes a stack gate in which a tunnel oxide film 12, a floating gate 13, a dielectric film 14 and a control gate 15 are sequentially stacked on a given region of a semiconductor substrate 11; and a source 16 and a drain 17 both of which are formed at given regions of the semiconductor substrate 11, as shown in FIG. 1. At this time, the tunnel oxide film 12 is formed in thickness of about 100 Å. The floating gate 13 for storing electric charges is made of a polysilicon film. Also, the dielectric film 14 has a stack structure of a lower oxide film, a nitride film and an upper oxide film so that it has a high dielectric constant. Further, the control gate 15 that serves as a word line of the cell is made of a polysilicon film.

In the flash memory cell constructed above, a programming operation is performed in which channel hot electrons, which are generated by application of a high voltage of about 9V to the control gate and a voltage of about 5V having a pulse of 5 $\mu$sec to the drain with the source and semiconductor substrate grounded, pass over the potential barrier of the tunnel oxide film and are then stored at the floating gate. An erase operation is performed in which electrons stored at the floating gate are drawn out by means of FN tunneling by applying a negative high voltage of about −8V to the control gate and a high voltage of about 8V to the semiconductor substrate.

In this stack-type flash memory cell, when the erase operation is performed, there is a problem that the degree of erase between cells is varied due to defects in the manufacturing process or oxidization at an edge of the tunnel oxide film, or the like. Further, there is a problem that distribution of the cells is bad due to generation of over-erased cell since erase is not self-limited by tunneling.

In order to solve the problems due to the over-erased cell, adequate capacitor is connected within the flash memory cell array, as shown in FIG. 2. In other words, as shown in FIG. 2, a plurality of PMOS transistors as a plurality of switching means that are driven by a given bias are connected to each of bit lines B/L. Also, a capacitor is connected between the plurality of the PMOS transistors and the ground terminal Vss. With this structure, it is possible to solve an over-erase problem by means of a soft program of a self-converged mode using the hot electrons that are generated in a diode reverse bias state between the drain and a bulk after the cells are erased. In this mode, however, it was found that the capacitance required to erase 1 sector (0.5M bits) is about 100 through 300 pF. In case that the capacitance of 100 through 300 pF is generated by a gate oxide film only, it was found that an area of 300 through 1000 $\mu$m$^2$ is required. In other words, the conventional method could solve distribution of the cell but require lots of chip size.

SUMMARY OF THE INVENTION

The present invention is contrived to solve the above problems and an object of the present invention is to provide a flash memory device capable of improving an erase mode and preventing power consumption by improving distribution of cells without increasing the chip size compared to addition of conventional capacitor, in a way that one flash memory cell array serving as a capacitor is connected to a drain of the other flash memory cell array in order to generate a soft program of a self-converged mode.

As described above, according to the prior art, if adequate capacitor is connected within the flash memory cell array, it was found that an over-erase problem could be solved by means of a soft program of a self-converged mode using hot electrons that are generated in a diode reverse bias state between a drain and a bulk after the cells are erased. At this time, however, the chip size is increased in order to implement the capacitor. On the contrary, according to the present invention, one flash memory cell array used as capacitor is connected to a drain of the other flash memory cell array. Due to this structure, a soft program of a self-converged mode can be used without increasing the chip size.

In order to accomplish the above object, a flash memory device according to the present invention, is characterized in that it comprises a first memory cell array having a plurality of first flash memory cells of which a gate of each cell of the plurality of first flash memory cells being connected to a respective first word line and a terminal of each cell of the plurality of first flash memory cells being connected to a respective first bit line; a plurality of switching means each having first and second terminals, the first terminal of each switching means being connected to the respective first bit line; and a second flash memory cell array having a plurality of second flash memory cells of which a gate of each cell of the plurality of second flash memory cells being connected to a common second word line and a terminal of each cell of the plurality of second flash memory cells being connected to a respective second bit liner wherein the second terminals of the plurality of the switching means are commonly connected to the common second word line.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
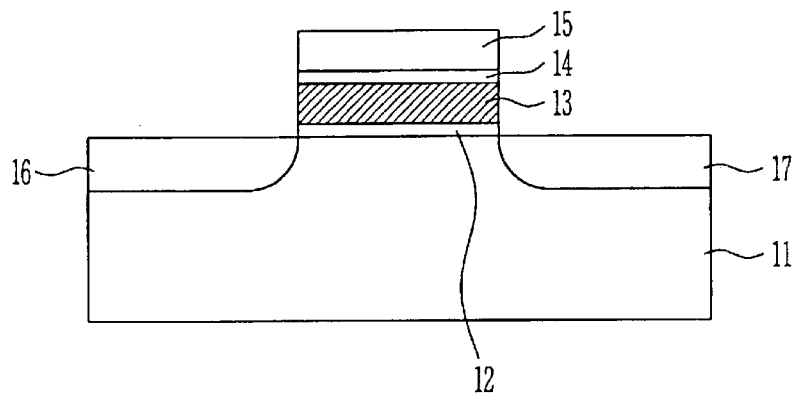
FIG. 1 is a cross-sectional view of a general flash memory cell.
Figure 2:
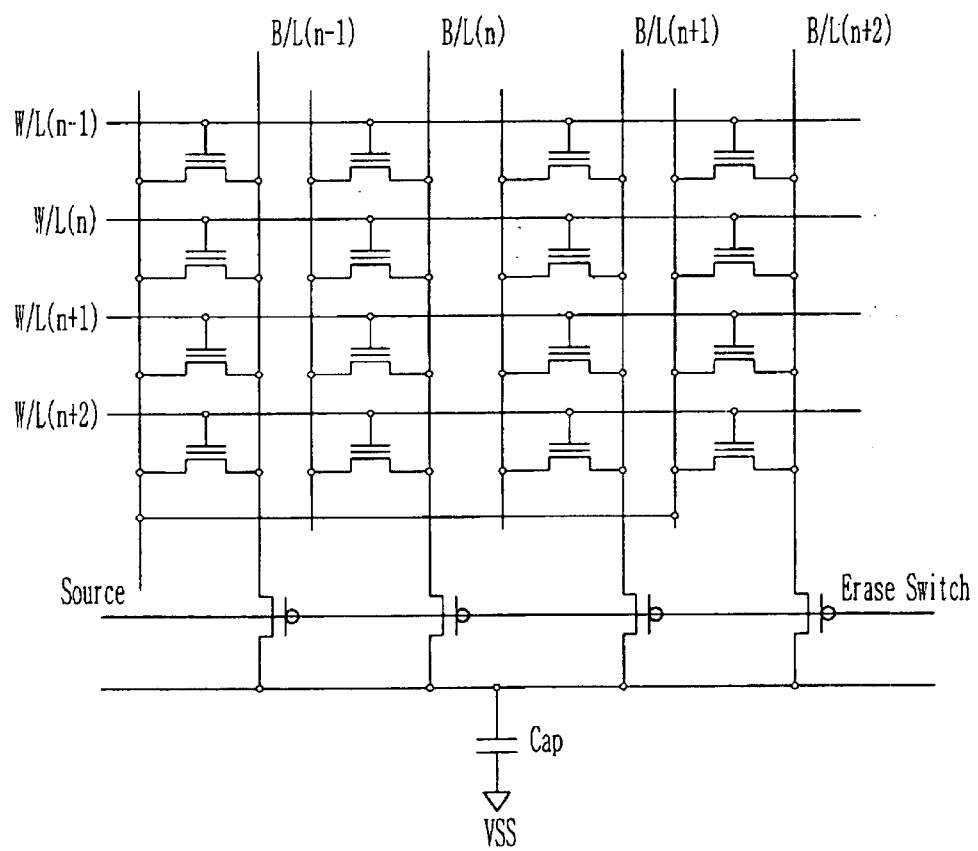
FIG. 2 shows a structure of a flash memory cell array for improving distribution of erase cells.

The present invention will be described in detail by way of a preferred embodiment with reference to accompanying drawings, in which like reference numerals are used to identify the same or similar parts.

Figure 3:
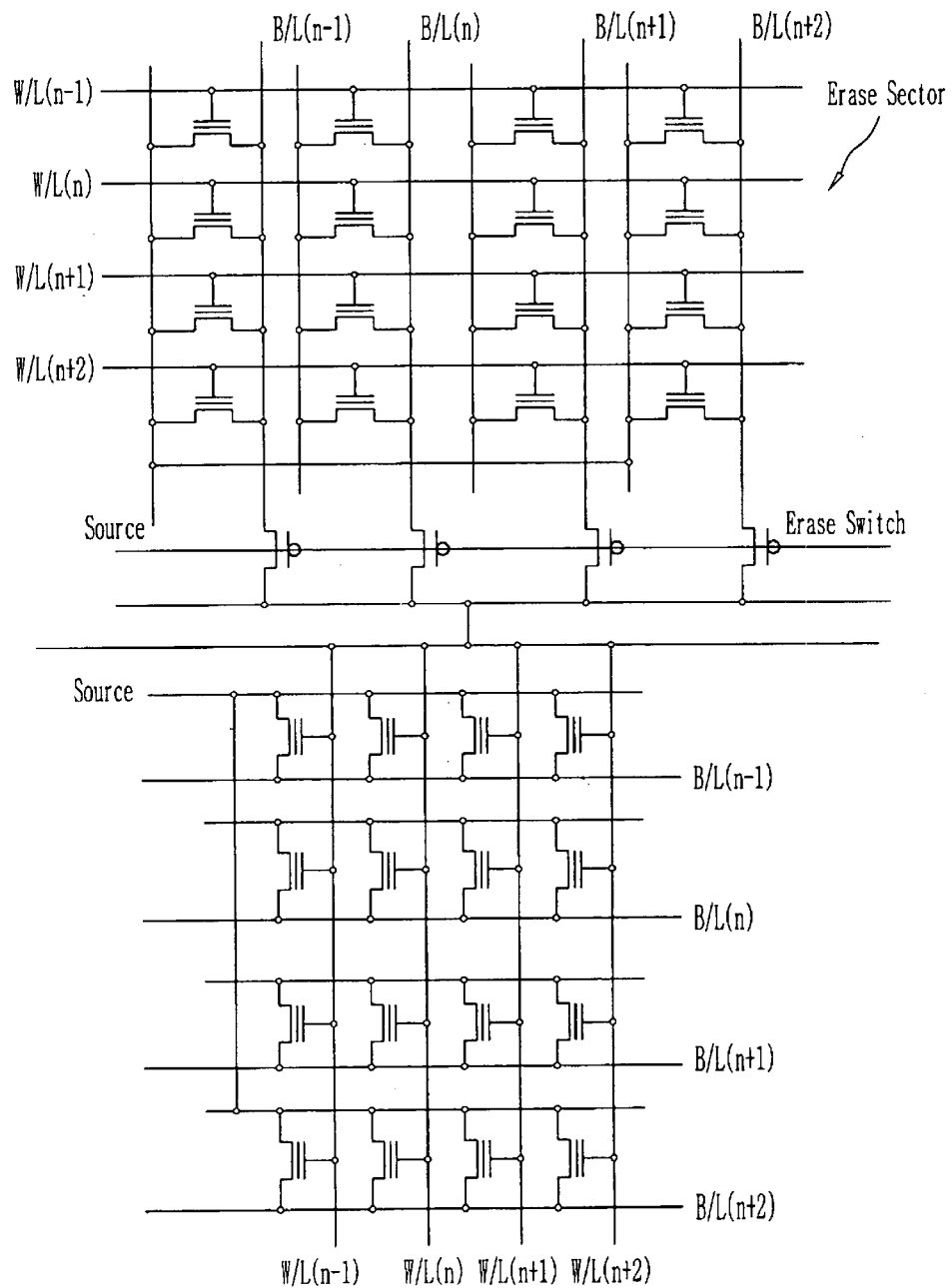
FIG. 3 shows a structure of a flash memory cell array for reducing distribution of erase cells and a chip size according to the present invention.

FIG. 3 shows a structure of a flash memory cell array for reducing distribution of erase cells and a chip size according to the present invention.

Each of PMOS transistors as erase switches are connected to each of bit lines B/L(n−1), B/L(n), B/L(n+1) and B/L(n+2) of a flash memory cell array in one sector in which a plurality of flash memory cells are connected by a plurality of word lines W/L(n−1), W/L(n), W/L(n+1) and W/L(n+2) and a plurality of bit lines B/L(n−1), B/L(n), B/L(n+1) and B/L(n+2). Also, a common terminal of the plurality of the PMOS transistors and a flash memory cell array in the other sector are connected, wherein word lines W/L(n−1), W/L(n), W/L(n+1) and W/L(n+2) of each of flash memory cells in the other sector are connected to the common terminal of the PMOS transistors. At this time, the flash memory cell array in the other sector serve as capacitor.

Figure 4:
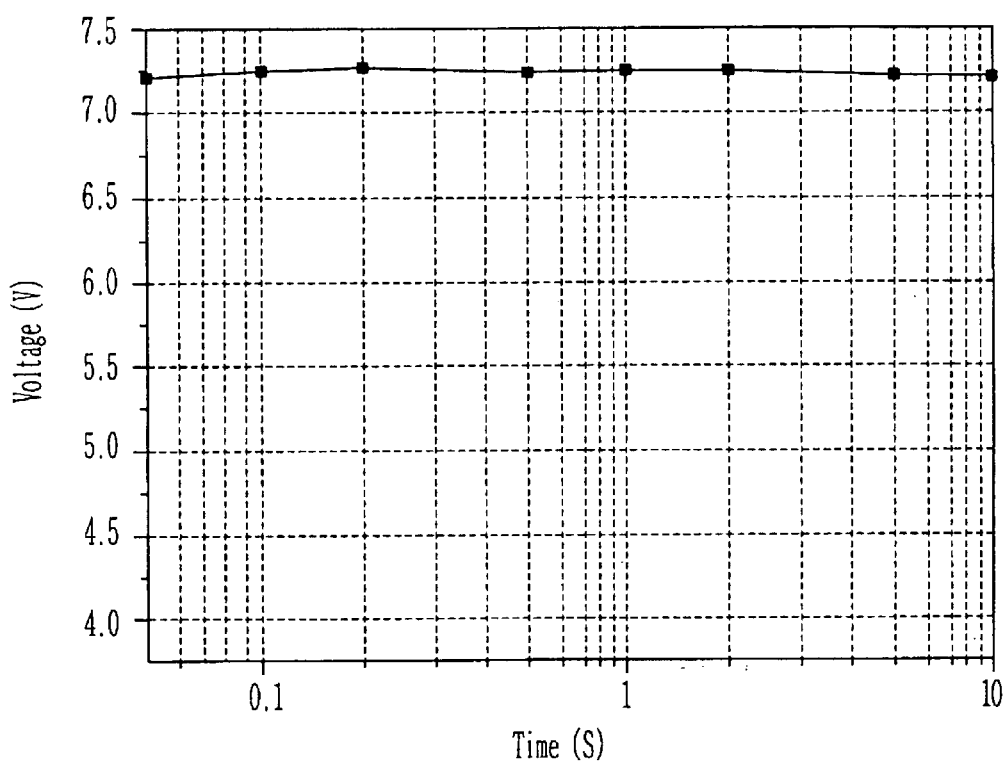
FIG. 4 shows a gate stress characteristic graph of the flash memory cell.

The reason why the other flash memory cell array serves as the capacitor will be explained as follows. The flash memory cell itself has a structure in which the capacitor is serially connected by a dielectric film and a tunnel oxide film. In other words, if a characteristic of the flash memory cell is stable against a gate stress voltage of about 8V, the flash memory cell itself can be used as the capacitor. At this time, the reason why the gate stress voltage is set to about 8V is as follows. Upon an erase operation of the cell, a voltage of about 8V is applied to the bulk, and a source and a drain are floated. At this time, as a forward bias voltage is applied to the bulk and the drain, the drain is in a floating state but the drain voltage has almost 8V, experimentally 7.2V. As shown in FIG. 3, however, as this voltage is applied to the gate of the other flash memory cell array through the PMOS transistor, the flash memory cell array serving as the capacitor is applied with a gate voltage of 8V. The gate stress characteristic of the flash memory cell is shown in FIG. 4. FIG. 4 shows a characteristic curve when the gate voltage of 10V is applied, with the source and drain floated and the substrate applied with a voltage of 0V. In the drawing, a characteristic curve up to 10 seconds is shown. However, it could be that there is not a significant change in a state of the cell for several hours even with the voltage of 10V. Therefore, it is possible to use the other flash memory cell array as the capacitor.

Figure 5:
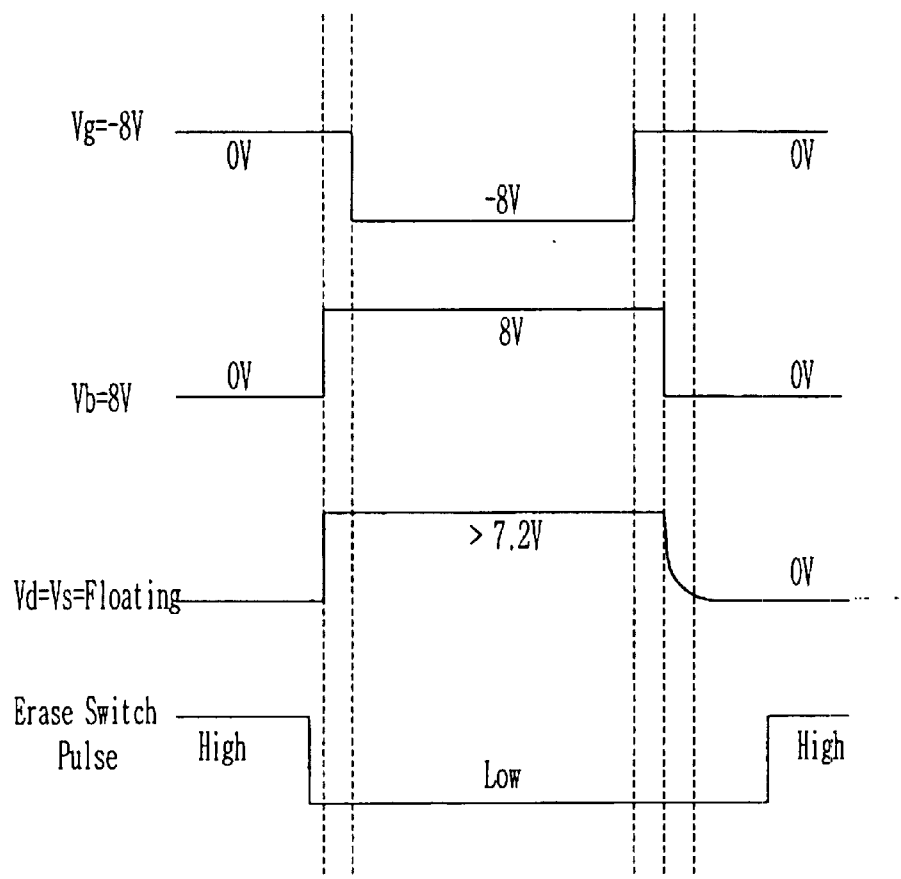
FIG. 5 is an erase pulse timing diagram of the flash memory cell.

An erase pulse timing diagram for erasing the flash memory device constructed like FIG. 3 is shown in FIG. 5. As shown, in order to erase a given sector of the flash memory device, a voltage Vg of −8V is applied to the gate and a voltage Vb of 8V is applied to the substrate, with the source and drain floated (Vd=Vs=Floating). Also, in order to drive the PMOS transistor, a LOW pulse as an erase switch pulse is applied. By doing so, a voltage of about 7.2V is applied to the source and drain that maintain a floating state.

The capacitance of a single 0.25 flash memory cell is about 0.3 fF and the capacitance of 1 sector (0.5 MB) thus becomes about 300 pF. Therefore, even though the single sector is used, the sector can be used as the capacitor that does not increase the size of a chip while improving sufficiently distribution of a erase cell. If the entire sectors are used as the capacitor in the 8M flash chip, it is not required to connect additional capacitor even though the size of the cell is reduced by about 1/10.

Figure 6:
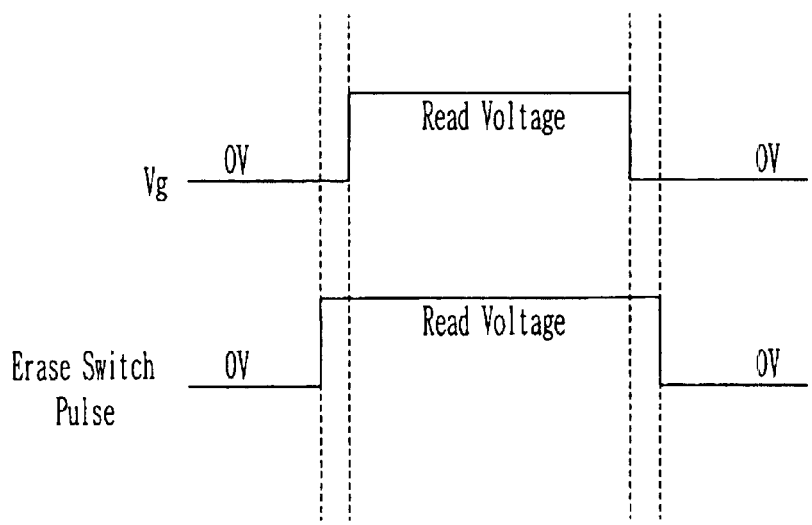
FIG. 6 is a read pulse timing diagram of the flash memory cell.

In the sector structure of the flash memory device according to the present invention, however, the gate of the cell is connected to the PMOS transistor serving as the erase switch in the drain side of the other sector. In order to prevent drawing of current toward the drain side in the other sector cells upon a read operation of the cell, it is required to separately adjust the voltage of an erase switch PMOS transistor. In other words, in order to prevent drawing of current toward the PMOS transistor, it is required to set the gate voltage Vg of the cell and the gate voltage (Erase Switch Pulse) of the erase switch to the same read voltage so that current does not draw toward the drain side of the other sector cell. The pulse timing diagram thereof is shown in FIG. 6.

As mentioned above, according to the present invention, an erase switch is connected to each of word lines of one flash memory cell array and the other flash memory cell array used as a capacitor is connected to a common terminal of the erase switch. Therefore, the present invention has an outstand advantages that it can reduce the manufacturing cost of a product without increasing the size of a chip even though a self-converged erase mode is employed.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A flash memory device, comprising:
   a first memory cell array having a plurality of first flash memory cells of which a gate of each cell of the plurality of first flash memory cells being connected to a respective first word line and a terminal of each cell of the plurality of first flash memory cells being connected to a respective first bit line;
   a plurality of switching means each having first and second terminals, the first terminal of each switching means being connected to the respective first bit line; and
   a second flash memory cell array having a plurality of second flash memory cells of which a gate of each cell of the plurality of second flash memory cells being connected to a common second word line and a terminal of each cell of the plurality of second flash memory cells being connected to a respective second bit line;
   wherein the second terminals of the plurality of the switching means are commonly connected to the common second word line.

2. The flash memory device as claimed in claim in claim 1, wherein each one of the plurality of switching means includes a PMOS transistor that is turned on during an erase operation and of which a gate is applied with a read voltage during a read operation.

* * * * *